United States Patent
Kim et al.

(10) Patent No.: US 7,131,049 B2
(45) Date of Patent: Oct. 31, 2006

(54) TRANSMISSION/RECEPTION APPARATUS AND METHOD FOR PACKET RETRANSMISSION IN A CDMA MOBILE COMMUNICATION SYSTEM

(75) Inventors: Hun-Kee Kim, Seoul (KR); Gin-Kyu Choi, Seoul (KR); Jae-Seung Yoon, Songnam-shi (KR); Noh-Sun Kim, Taejon-Kwangyokshi (KR); Jun-Sung Lee, Seoul (KR); Yong-Suk Moon, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 970 days.

(21) Appl. No.: 10/218,144

(22) Filed: Aug. 12, 2002

(65) Prior Publication Data
US 2003/0088822 A1    May 8, 2003

(30) Foreign Application Priority Data
Aug. 17, 2001    (KR) ............................... 2001-49702

(51) Int. Cl.
*H03M 13/35* (2006.01)
*H04L 1/16* (2006.01)

(52) U.S. Cl. ...................... 714/751; 714/790
(58) Field of Classification Search ............... 714/751, 714/790
See application file for complete search history.

(56) References Cited

U.S. PATENT DOCUMENTS

| | | | |
|---|---|---|---|
| 5,657,325 A * | 8/1997 | Lou et al. ................ 370/334 |
| 6,052,821 A * | 4/2000 | Chouly et al. ............. 714/790 |
| 6,308,294 B1 * | 10/2001 | Ghosh et al. ............. 714/751 |
| 6,366,601 B1 * | 4/2002 | Ghosh et al. ............. 375/130 |
| 6,529,561 B1 * | 3/2003 | Sipola ................... 375/295 |
| 6,631,127 B1 * | 10/2003 | Ahmed et al. ............. 370/349 |
| 6,738,370 B1 * | 5/2004 | Ostman .................. 370/349 |
| 6,778,558 B1 * | 8/2004 | Balachandran et al. .... 370/470 |
| 6,877,130 B1 * | 4/2005 | Kim et al. ............... 714/790 |
| 6,909,758 B1 * | 6/2005 | Ramesh et al. ............ 375/340 |
| 6,987,778 B1 * | 1/2006 | Sindhushayana et al. .. 370/468 |

FOREIGN PATENT DOCUMENTS

| WO | WO 98/49785 | 11/1998 |
|---|---|---|
| WO | WO 00/54430 | 9/2000 |

OTHER PUBLICATIONS

European Search Report dated Feb. 20, 2003, issued in a counterpart application, namely, Appln. No. 02024462.0.

* cited by examiner

*Primary Examiner*—Stephen M. Baker
(74) *Attorney, Agent, or Firm*—Dilworth & Barrese LLP

(57) ABSTRACT

A transmission/reception apparatus and method for performing packet retransmission considering a channel environment in a CDMA mobile communication system. Upon receiving a retransmission request from a receiver, the apparatus and method selects a modulation type to be used according to a condition of a transmission channel, and changes the previously used puncturing pattern in order to output the proper number of coded bits for the selected modulation type.

32 Claims, 7 Drawing Sheets

- I : ith transmission
- M : Previous (old) Modulation Order
- M : Present (new) Modulation Order
- $(B_N-B_O)$ : # of Decreased/Increased per Symbol
- L : # of Bits to be added in Puncturing Pattern
- B : # of Symbols in existing puncturing pattern based on previous modulation

TRANSMISSION/RECEPTION APPARATUS AND METHOD FOR PACKET RETRANSMISSION IN A CDMA MOBILE COMMUNICATION SYSTEM

PRIORITY

This application claims priority to an application entitled "Transmission/Reception Apparatus and Method for Packet Retransmission in a CDMA Mobile Communication System" filed in the Korean Industrial Property Office on Aug. 17, 2001 and assigned Serial No. 2001-49702, the contents of which are hereby incorporated by reference.

BACKGROUND OF THE INVENTION

1. Field of the Invention

The present invention relates generally to a transmission/reception apparatus and a method for packet retransmission in a CDMA (Code Division Multiple Access) mobile communication system, and in particular, to a transmission/reception apparatus and a method for performing packet retransmission according to a channel environment.

2. Description of the Related Art

These days, mobile communication systems have evolved from an early voice-based communication system into a high-speed, high-quality radio data packet communication system for providing a data service and a multimedia service. In addition, a $3^{rd}$ generation mobile communication system, divided into an asynchronous 3GPP ($3^{rd}$ Generation Partnership Project) system and a synchronous 3GPP2 ($3^{rd}$ Generation Partnership Project 2) system, is being standardized for a high-speed, high quality radio data packet service. For example, standardization on HSDPA (High-Speed Downlink Packet Access) is performed by the 3GPP, while standardization on 1xEV-DV is performed by the 3GPP2. Such standardizations are carried out to find out a solution for a high-speed, high-quality radio data packet transmission service of 2 Mbps or over in the $3^{rd}$ generation mobile communication system. Meanwhile, a $4^{th}$ generation mobile communication system is proposed to provide a high-speed, high-quality multimedia service superior to that of the $3^{rd}$ generation mobile communication system.

In a mobile communication system providing such a communication service, a principal factor of impeding the high-speed, high-quality radio data service lies in the radio channel environment. The radio channel environment frequently changes due to a variation in signal power caused by white nose and fading, shadowing, Doppler effect caused by a movement of and a frequent change in speed of a UE (User Equipment), and interference caused by other users and a multipath signal. Therefore, in order to provide the high-speed radio data packet service, there is a need for an improved technology capable of increasing adaptability to the variation in the channel environment in addition to the general technology provided for the existing $2^{nd}$ or $3^{rd}$ generation mobile communication system. A high-speed power control method used in the existing system also increases adaptability to the variation in the channel environment. However, both the 3GPP and the 3GPP2, carrying out standardization on the high-speed data packet transmission, make reference to AMCS (Adaptive Modulation/Coding Scheme) and HARQ (Hybrid Automatic Repeat Request).

AMCS is a technique for adaptively changing a modulation type and a coding rate of a channel encoder according to a variation in the downlink channel environment. Commonly, to detect the downlink channel environment, a UE measures a signal-to-noise ratio (SNR) and transmits the SNR information to a Node B over an uplink. The Node B predicts the downlink channel environment based on the SNR information, and designates proper modulation type and coding rate according to the predicted value. The HSDPA and 1xEV-DV consider using the modulations of QPSK (Quadrature Phase Shift Keying), 8PSK (8-ary Phase Shift Keying), 16QAM (16-ary Quadrature Amplitude Modulation) and 64QAM (64-ary Quadrature Amplitude Modulation), and the coding rates of ½ and ¾. Therefore, an AMCS system applies the high-order modulations (16QAM and 64QAM) and the high coding rate ¾ to the UE located in the vicinity of the Node B, having a good channel environment, and applies the low-order modulations (QPSK and 8PSK) and the low coding rate ½ to the UE located in a cell boundary. In addition, compared with the existing high-speed power control method, AMCS decreases an interference signal, thereby improving the average system performance.

HARQ is a link control technique for correcting an error by retransmitting the errored data upon occurrence of a packet error at initial transmission. Generally, HARQ is classified into Chase Combining (CC), Full Incremental Redundancy (FIR), and Partial Incremental Redundancy (PIR).

CC is a technique for transmitting a packet such that the whole packet transmitted at retransmission is equal to the packet transmitted at initial transmission. In this technique, a receiver combines the retransmitted packet with the initially transmitted packet previously stored in a buffer thereof by a predetermined method. By doing so, it is possible to increase reliability of coded bits input to a decoder, thus resulting in an increase in the system performance. Combining the two same packets is similar to repeated coding in terms of effects, so it is possible to attain a performance gain of about 3 dB on the average.

FIR is a technique for retransmitting a packet comprised of only the parity bits generated from the channel encoder instead of the initially transmitted packet, thus increasing a decoding gain of a decoder in the receiver. That is, the decoder uses the new parity bits as well as the initially transmitted information resulting in a decrease in the coding rate, thereby improving performance of the decoder. It is well known in coding theory that a performance gain of a low coding rate is higher than that of repeated coding. Therefore, FIR is superior to CC in terms of the performance gain.

Unlike FIR, PIR is a technique for transmitting a combined data packet of the systematic bits and the new parity bits at retransmission. Therefore, PIR can obtain the similar effect to CC by combining the retransmitted systematic bits with the initially transmitted systematic bits during decoding, and also obtain the similar effect to the FIR by performing the decoding using the parity bits. PIR has a coding rate slightly higher than that of the FIR, showing performance between FIR and CC. However, HARQ should be considered in the light of not only the performance, but also the system complexity such as a buffer size and signaling load of the receiver, so it is not easy to determine by only one of them.

AMCS and HARQ are separate techniques for increasing adaptability to the variation in the link environment. Preferably, it is possible to remarkably improve the system performance by combining the two techniques. That is, the transmitter determines a modulation type and a coding rate that is proper for a downlink channel condition by AMCS, and then transmits packet data according to the determined modulation type and coding rate, and the receiver requests a retransmission upon failure to decode the data packet transmitted by the transmitter. Upon receipt of the retransmission request from the receiver, the Node B retransmits the data packet by HARQ technique.

FIG. 1 illustrates a transmitter in a conventional mobile communication system for high-speed packet data transmission, wherein various AMCSs and HARQs can be realized by controlling a channel encoder 112 and a modulator 118.

Referring to FIG. 1, the channel encoder 112 is comprised of an encoder and a puncturer. When input data that is proper to a data rate is applied to an input terminal of the channel encoder 112, the encoder performs encoding in order to decrease a transmission error rate. The puncturer performs puncturing on the coded bits from the encoder according to a puncturing pattern. The puncturing pattern is provided from a puncturing pattern selector 120 according to a coding rate and a modulation order previously determined by a controller 122. The coded bits punctured by the puncturer are serially provided to an interleaver 116. The interleaver 116 interleaves the punctured coded bits. The interleaver 116, a device for coping with fading that occurs in a radio channel, disperses bits constituting one information word (e.g., one word of a voice signal) thereby to decrease a probability that one information word will be lost at the same time. The interleaved signal by the interleaver 116 is modulated by the modulator 118 by a given symbol mapping method, and transmitted over a radio channel. The symbol mapping method performed in the modulator 118 is determined according to a modulation type previously determined by the controller 122. Further, a rate matcher 114 is illustrated in FIG. 1. The rate matcher 114 performs rate matching to the number of bits transmitted over a physical channel by performing puncturing or repetition on systematic bits and parity bits provided from the channel encoder 112.

A receiver performs error check on a packet received from the transmitter and informs the transmitter of the error check result. If there is no error, the transmitter transmits a new packet. However, if there is an error, the transmitter retransmits the previously transmitted packet. Retransmission of the previously transmitted data is performed by one of the above-stated HARQ types. According to the HARQ type used for the retransmission, the receiver uses the same puncturing pattern (for the CC) or selects a new puncturing pattern (for the FIR or PIR).

A detailed structure of a turbo encoder used as the channel encoder 112 of FIG. 1 is illustrated in FIG. 2. Referring to FIG. 2, the channel encoder 112 includes encoders 212 and 214 with a mother coding rate ⅙, and a puncturer 216. It is well known that a channel coding technique using the turbo encoder shows performance closets to the Shannon limit in terms of a bit error rate (BER) even at a low SNR. Therefore, in the 3GPP and 3GPP2 carrying out standardization on the future mobile communication system for high-speed multimedia data transmission with high reliability, the turbo encoder is adopted as a standard channel encoder of the HSDPA and the 1xEV-DV.

Outputs of the encoders 212 and 214 are divided into systematic bits and parity bits. The "systematic bits" refer to actual systematic bits to be transmitted, while the "parity bits" refer to a signal added to help the receiver correct a possible transmission error. The puncturer 216 selectively punctures the systematic bits or the parity bits according to a puncturing pattern selected by a puncturing pattern selector 120, thus satisfying a predetermined coding rate and modulation type.

Referring to FIG. 2, an input signal is output as a systematic bit X and, at the same time, provided to the first channel encoder 212. The first encoder 212 encodes the input signal and outputs two different parity bits Y1 and Y2. Further, an interleaver 210 interleaves the input signal. The interleaved signal is output as an interleaved systematic bit X', and at the same time, provided to the second encoder 214. The second encoder 214 encodes the interleaved signal and outputs two different parity bits Z1 and Z2. Coded bits including the systematic bits X and X', and the parity bits Y1, Y2, Z1, and Z2 are provided to the puncturer 216. The puncturer 216 punctures the coded bits using a puncturing pattern selected by the puncturing pattern selector 120 according to a control signal from the controller 122 or a retransmission request signal, and outputs desired systematic bits and parity bits.

The puncturing pattern used by the puncturer 216 is provided from the puncturing pattern selector 120. The puncturing pattern depends upon the coding rate and the HARQ. That is, in the case of the CC, it is possible to transmit the same packet at both initial transmission and retransmission by puncturing the coded bits such that the puncturer 216 has a fixed combination of the systematic bits and the parity bits according to a given coding rate. In the case of the FIR and PIR, the puncturer 216 punctures the coded bits in a combination of the systematic bits and the parity bits according to the given coding rate at initial transmission, and punctures the coded bits in a different combination at each retransmission. In the case of both the PIR and the FIR, the puncturing is performed in various combinations of the parity bits, resulting in an increase in the overall coding rate.

Puncturing pattern matrixes that can be selected by the puncturing pattern selector 120 according to a combination of the HARQ (CC, PIR, and FIR) and the coding rate (½ and ¾) are shown by the following formulas. In the following formulas, $P_i$ indicates a puncturing pattern matrix used at $i^{th}$ retransmission including initial transmission. In the puncturing pattern, "1" indicates a non-punctured transmission bit, and "0" indicates a punctured bit. The input bits sequentially repeatedly use the puncturing pattern from the left column to the right column. A size of a row of the puncturing pattern is determined according to a mother coding rate (⅙ is used herein), and a size of the column is determined according to intention of the designer.

Of the following formulas, Equation (1) to (3) show puncturing pattern matrixes for the CC, the PIR and the FIR at the coding rate ½, respectively. In the puncturing pattern matrixes shown in Equation (1) to (3), each column includes two 1's, and one parity bit is transmitted for each systematic bit X.

Of the following formulas, Equation (4) to (6) show puncturing pattern matrixes for the CC, the PIR and the FIR at the coding rate ¾, respectively. The puncturing pattern matrixes shown in Equation (4) to (6), are defined such that one parity bit is transmitted for every three systematic bits X. However, in the case of the FIR, only parity bits are transmitted at retransmission, so 1's in the puncturing pattern matrix shown in Equation (6) are all assigned to the parity bits.

Equation (1) shows puncturing pattern matrixes for the CC HARQ at the coding rate ½.

$$P_1 = \begin{bmatrix} 1 & 1 \\ 1 & 0 \\ 0 & 0 \\ 0 & 0 \\ 0 & 0 \\ 0 & 1 \end{bmatrix}$$

$$P_2 = \begin{bmatrix} 1 & 1 \\ 1 & 0 \\ 0 & 0 \\ 0 & 0 \\ 0 & 0 \\ 0 & 1 \end{bmatrix}$$

$$P_3 = \begin{bmatrix} 1 & 1 \\ 1 & 0 \\ 0 & 0 \\ 0 & 0 \\ 0 & 0 \\ 0 & 1 \end{bmatrix}$$

$$P_4 = \begin{bmatrix} 1 & 1 \\ 1 & 0 \\ 0 & 0 \\ 0 & 0 \\ 0 & 0 \\ 0 & 1 \end{bmatrix} \quad \text{Equation (1)}$$

Equation (2) shows puncturing pattern matrixes for the PIR HARQ at the coding rate ½.

$$P_1 = \begin{bmatrix} 1 & 1 \\ 1 & 0 \\ 0 & 0 \\ 0 & 0 \\ 0 & 0 \\ 0 & 1 \end{bmatrix}$$

$$P_2 = \begin{bmatrix} 1 & 1 \\ 1 & 0 \\ 0 & 0 \\ 0 & 0 \\ 0 & 1 \\ 0 & 0 \end{bmatrix}$$

$$P_3 = \begin{bmatrix} 1 & 1 \\ 0 & 0 \\ 1 & 0 \\ 0 & 0 \\ 0 & 0 \\ 0 & 1 \end{bmatrix}$$

$$P_4 = \begin{bmatrix} 1 & 1 \\ 0 & 0 \\ 1 & 0 \\ 0 & 0 \\ 0 & 1 \\ 0 & 0 \end{bmatrix} \quad \text{Equation (2)}$$

Equation (3) shows puncturing pattern matrixes for the FIR HARQ at the coding rate ½.

$$P_1 = \begin{bmatrix} 1 & 1 \\ 1 & 0 \\ 0 & 0 \\ 0 & 0 \\ 0 & 0 \\ 0 & 1 \end{bmatrix}$$

$$P_2 = \begin{bmatrix} 0 & 0 \\ 1 & 0 \\ 1 & 0 \\ 0 & 0 \\ 0 & 1 \\ 0 & 1 \end{bmatrix}$$

$$P_3 = \begin{bmatrix} 0 & 0 \\ 0 & 1 \\ 0 & 1 \\ 0 & 0 \\ 1 & 0 \\ 1 & 0 \end{bmatrix}$$

$$P_4 = \begin{bmatrix} 0 & 0 \\ 1 & 0 \\ 0 & 1 \\ 0 & 0 \\ 1 & 0 \\ 0 & 1 \end{bmatrix} \quad \text{Equation (3)}$$

Equation (4) shows puncturing pattern matrixes for the CC HARQ at the coding rate ¾.

$$P_1 = \begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix}$$

$$P_2 = \begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix}$$

$$P_3 = \begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} \quad \text{Equation (4)}$$

Equation (5) shows puncturing pattern matrixes for the PIR HARQ at the coding rate ¾.

$$P_1 = \begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} \quad \text{Equation (5)}$$

$$P_2 = \begin{bmatrix} 1 & 1 & 1 & 1 & 1 & 1 \\ 0 & 0 & 0 & 0 & 0 & 0 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \end{bmatrix}$$

$$P_3 = \begin{bmatrix} 1 & 1 & 1 & 1 & 1 & 1 \\ 0 & 0 & 0 & 0 & 0 & 0 \\ 0 & 0 & 0 & 0 & 0 & 1 \\ 0 & 0 & 0 & 0 & 0 & 0 \\ 0 & 0 & 1 & 0 & 0 & 0 \\ 0 & 0 & 0 & 0 & 0 & 0 \end{bmatrix}$$

Equation (6) shows puncturing pattern matrixes for the FIR HARQ at the coding rate ¾.

$$P_1 = \begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} \quad \text{Equation (6)}$$

$$P_2 = \begin{bmatrix} 0 & 0 & 0 & 0 & 0 & 0 \\ 1 & 0 & 0 & 0 & 1 & 0 \\ 0 & 1 & 0 & 1 & 0 & 0 \\ 0 & 0 & 0 & 0 & 0 & 0 \\ 0 & 0 & 1 & 0 & 0 & 1 \\ 0 & 0 & 1 & 0 & 0 & 1 \end{bmatrix}$$

$$P_3 = \begin{bmatrix} 0 & 0 & 0 & 0 & 0 & 0 \\ 0 & 0 & 1 & 0 & 0 & 1 \\ 0 & 0 & 1 & 0 & 0 & 1 \\ 0 & 0 & 0 & 0 & 0 & 0 \\ 1 & 0 & 0 & 0 & 1 & 0 \\ 0 & 1 & 0 & 1 & 0 & 0 \end{bmatrix}$$

As shown in Equation (1) and Equation (4), in the case of the CC, the same puncturing pattern matrix is used regardless of the number of transmissions. As shown in Equation (2) and Equation (5), in the case of the PIR, the puncturing pattern matrix for transmitting the same systematic bits at both initial transmission and retransmission and transmitting the parity bits in various combinations is used. As shown in Equation (3) and Equation (6), the case of the FIR, the puncturing pattern matrix for not transmitting the systematic bits from $i^{th}$ ($i \geq 2$) retransmission and transmitting only the parity bits in various combinations is used.

As described above, the HARQ and the AMCS have contributed to an improvement in the overall system performance for high-speed packet communication. In addition, many attempts are being made to improve these techniques. For example, a technique for changing an AMCS rate in response to a variation in a condition of a transmission channel during retransmission has been proposed. However, in the AMCS rate changing technique, a modulation order and a coding rate are separately changed, so an amount of transmission data cannot coincide with TTI (Transmission Time Interval), a fixed transmission unit. Therefore, the TTI should vary according to the varying modulation order and coding rate. Since the variation in the TTI causes a considerable increase in complexity of a transceiver, it is difficult to realize this technique. For example, in order to use different TTIs at initial transmission and retransmission, supplemental information on a length of the TTIs should be transmitted from a transmitter to a receiver, or the receiver should have the information. In addition, the receiver should have a memory designed to coincide with the maximum length regardless of the length of the varying TTI.

Meanwhile, using the channel information determined for initial transmission again at retransmission as described above may become a major factor in decreasing the system performance. For example, retransmission is requested when initial transmission is failed. The failure of initial transmission occurs because the channel information estimated at initial transmission is incorrect or the channel environment has been changed during a delay time from the estimation until actual transmission. Since it is difficult to correctly estimate the channel environment and the channel environment is subject to a frequent change, maintaining the channel information estimated for initial transmission during transmission may become a factor in decreasing the overall system efficiency.

SUMMARY OF THE INVENTION

It is, therefore, an object of the present invention to provide a packet data transmission/reception apparatus and method suitable for high-speed packet data transmission in a mobile communication system employing AMCS (Adaptive Modulation/Coding Scheme).

It is another object of the present invention to provide an apparatus and method for optimally coping with a variation in channel environments while maintaining a fixed packet transmission time interval (TTI) in a mobile radio packet communication system employing HARQ (Hybrid Automatic Repeat Request).

It is further another object of the present invention to provide a packet data transmission/reception apparatus and method for improving reliability of a transmission packet and an overall performance of a mobile radio packet communication system by rapidly controlling a modulation order of transmission data according to channel environments.

According to a first aspect of the present invention, there is provided a method for generating a retransmission puncturing pattern matrix in order to transmit a packet unit including a stream of symbols and another stream of symbols according to a first modulation type and a second modulation type in response to a retransmission request from a receiver, in a mobile communication system puncturing coded bits from an encoder according to a first puncturing pattern matrix based on the first modulation type, and transmitting a packet unit including a stream of symbols obtained by symbol mapping the punctured coded bits by the first modulation type, from a transmitter to the receiver. The method comprises: calculating the number of bits per a puncturing pattern matrix, to be increased or decreased, by multiplying a difference $B_N - B_0$ between the number $B_N$ of coded bits that can be mapped to one symbol by the second modulation type and the number $B_0$ of coded bits that can be mapped to one symbol by the first modulation type, by the number B of symbols mapped to bits that are not punctured according to the first puncturing pattern matrix based on the first modulation type; generating a second puncturing pattern matrix based on the number of bits per the puncturing pattern matrix; and generating the retransmission puncturing pattern matrix by combining the first puncturing pattern matrix with the second puncturing pattern matrix.

According to a second aspect of the present invention, there is provided an apparatus for generating a retransmission puncturing pattern matrix in order to transmit a packet unit including a stream of symbols and another stream of symbols according to a first modulation type and a second modulation type in response to a retransmission request from a receiver, in transmitter for a mobile communication system including a puncturer for puncturing coded bits from an encoder according to a first puncturing pattern matrix given based on the first modulation type, and a modulator for generating a stream of symbols obtained by symbol mapping the punctured coded bits by the first modulation type. The apparatus comprises a controller for determining the second modulation type according to a variation in a transmission channel condition in response to the retransmission request; and a puncturing pattern generator for calculating the number of bits per a puncturing pattern matrix, to be increased or decreased, by multiplying a difference $B_N-B_0$ between the number $B_N$ of coded bits that can be mapped to one symbol by the second modulation type and the number $B_0$ of coded bits that can be mapped to one symbol by the first modulation type, by the number B of symbols mapped to bits that are not punctured according to the first puncturing pattern matrix given based on the first modulation type, generating a second puncturing pattern matrix based on the number of bits per the puncturing pattern matrix, and generating the retransmission puncturing pattern matrix by combining the first puncturing pattern matrix with the second puncturing pattern matrix.

According to a third aspect of the present invention, there is provided a method for generating a retransmission puncturing pattern matrix in order to decode coded bits and other coded bits according to a first modulation type and a second modulation type from a transmitter, in a receiver for a mobile communication system demodulating symbols transmitted in a packet unit by the first modulation type from the transmitter, and inserting 0's in the coded bits according to the first puncturing pattern matrix based on the first modulation type before decoding. The method comprises calculating the number of bits per a puncturing pattern matrix, to be increased or decreased, by multiplying a difference $B_N-B_0$ between the number $B_N$ of coded bits that can be mapped to one symbol by the second modulation type and the number $B_0$ of coded bits that can be mapped to one symbol by the first modulation type, by the number B of symbols mapped to bits that are not punctured according to the first puncturing pattern matrix given based on the first modulation type; generating a second puncturing pattern matrix based on the number of bits per the puncturing pattern matrix; and generating the retransmission puncturing pattern matrix by combining the first puncturing pattern matrix with the second puncturing pattern matrix.

According to a fourth aspect of the present invention, there is provided an apparatus for generating a retransmission puncturing pattern matrix in order to decode coded bits and other coded bits according to a first modulation type and a second modulation type from a transmitter, in a receiver for a mobile communication system including a demodulator for demodulating symbols transmitted in a packet unit by the first modulation type from the transmitter into coded bits, and a decoder for inserting 0's in the coded bits according to the first puncturing pattern matrix given based on the first modulation type before decoding. The apparatus comprises a controller for determining the second modulation type according to a variation in a transmission channel condition after sending a retransmission request to the transmitter; and a puncturing pattern generator for calculating the number of bits per a puncturing pattern matrix, to be increased or decreased, by multiplying a difference $B_N-B_0$ between the number $B_N$ of coded bits that can be mapped to one symbol by the second modulation type and the number $B_0$ of coded bits that can be mapped to one symbol by the first modulation type, by the number B of symbols mapped to bits that are not punctured according to the first puncturing pattern matrix given based on the first modulation type, generating a second puncturing pattern matrix based on the number of bits per the puncturing pattern matrix, and generating the retransmission puncturing pattern matrix by combining the first puncturing pattern matrix with the second puncturing pattern matrix.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENT

Figure 1:
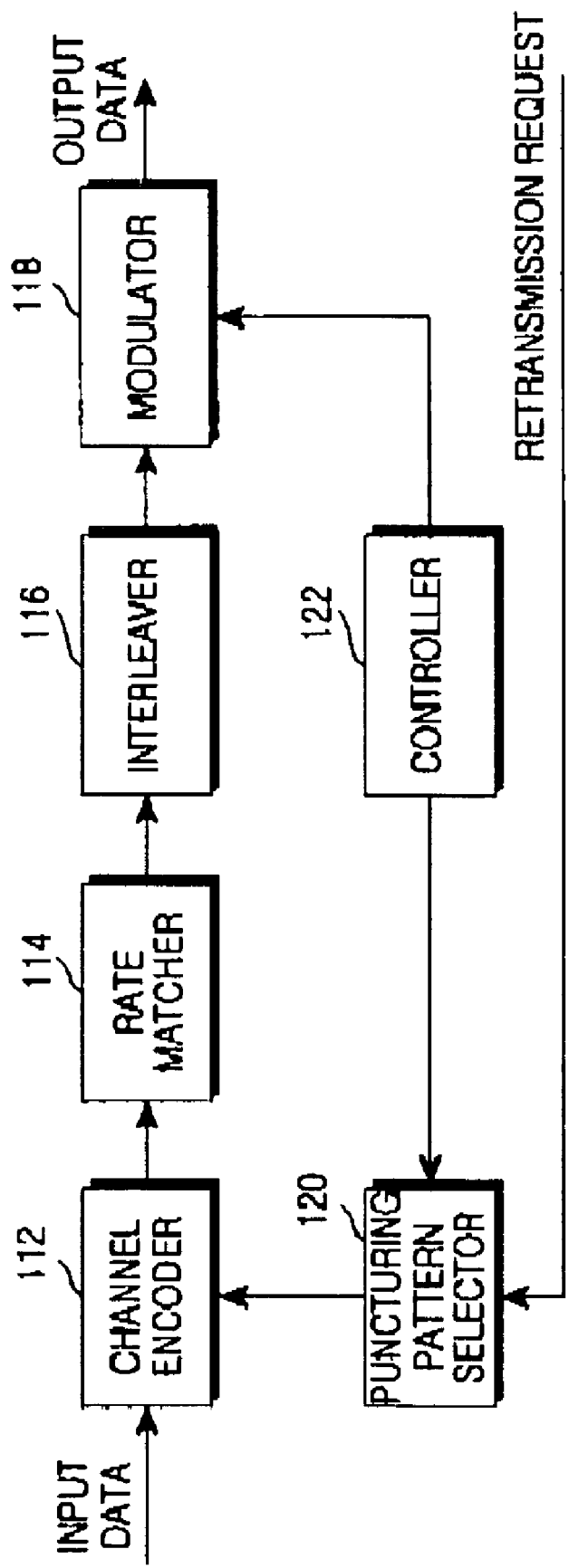
FIG. 1 illustrates a structure of a transmitter in a conventional mobile communication system for high-speed packet data transmission.

A preferred embodiment of the present invention will be described herein below with reference to the accompanying drawings. In the following description, well-known functions or constructions are not described in detail since they would obscure the invention in unnecessary detail.

The present invention provides a packet data transmission/reception apparatus and a method for properly coping with a variation in channel environments during retransmission while fixing a TTI. Here, "fixing a TTI" means fixing the number of transmission symbols, so the number of bits expressing one symbol must be changed in order to cope with a variation in the channel environments. This is equivalent to increasing/decreasing a modulation order by changing a modulation type. Table 1 illustrates a variation in the number of bits expressing one symbol according to a change in the modulation types.

TABLE 1

| Previous Modulation Type | New Modulation Type | Variation in Number of Bits |
| --- | --- | --- |
| QPSK | QPSK | 0 |
|  | 8 PSK | +1 |
|  | 16 QAM | +2 |
|  | 64 QAM | +4 |
| 8 PSK | QPSK | −1 |
|  | 8 PSK | 0 |
|  | 16 QAM | +1 |
|  | 64 QAM | +3 |
| 16 QAM | QPSK | −2 |
|  | 8 PSK | −1 |
|  | 16 QAM | 0 |
|  | 64 QAM | +2 |
| 64 QAM | QPSK | −4 |
|  | 8 PSK | −3 |
|  | 16 QAM | −2 |
|  | 64 QAM | 0 |

In Table 1, "variation in the number of bits" means a variation in the number of bits that can be mapped to one symbol when the modulation type changes from a previous modulation type to a new modulation type. As illustrated in Table 1, when the modulation types include QPSK, 8PSK, 16QAM and 64QAM, a difference between the modulation types in the number of bits expressing one symbol shows a maximum of 4.

Generally, retransmission is performed to retransmit initially transmitted data instead of new data, upon failure to transmit the data at initial transmission. As a result, the number of systematic bits and parity bits transmitted for the same data increases, thereby increasing a probability that a receiver will receive the data.

This technique applied to the present invention determines a modulation order according to a channel environment. That is, the modulation order is increased for the good channel environment. In contrast, the modulation order is decreased for the bad channel environment. The number of the bits increased or decreased according to the determined modulation order is satisfied in the puncturer. The existing puncturer has a fixed puncturing pattern for a specified coding rate (½ or ¾). However, a puncturer according to the present invention can freely change its puncturing pattern, making it possible to properly cope with a variation in the channel environment. Therefore, the present invention should satisfy the following conditions in order not to increase the complexity while more efficiently transmitting data compared with the conventional technique.

First Condition: a receiver of an AMCS mobile communication system shall inform a transmitter of transmission channel environment at stated periods (generally at each TTI). This technique has already been provided for uplink or downlink power control in the general mobile communication system.

Second Condition: both the transmitter and the receiver shall recognize a modulation order that varies according to the channel environment. That is, the transmitter and the receiver should be able to recognize the number of bits, which varies according to a change in the modulation order.

Third Condition: a puncturing pattern determined based on the number of bits, which varies according to a change in the modulation order, shall be previously agreed between the transmitter and the receiver.

An embodiment of the present invention will be described in detail herein below with reference to the accompanying drawings.

Figure 4:
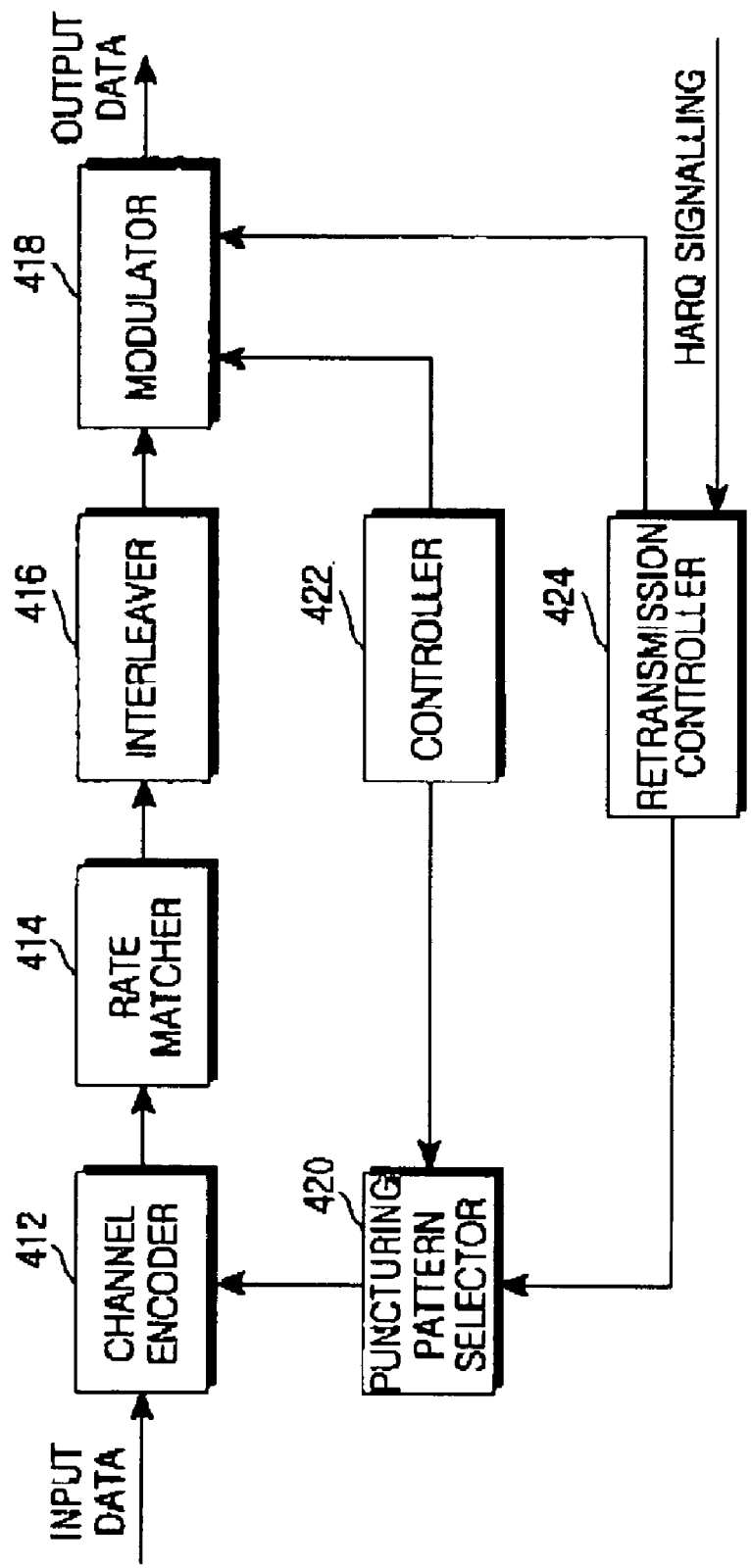
FIG. 4 illustrates a structure of a transmitter in a CDMA mobile communication system for high-speed packet transmission according to an embodiment of the present invention.

FIG. 4 illustrates a structure of a high-speed packet transmitter of a mobile radio packet communication system according to an embodiment of the present invention. In FIG. 4, the transmitter realizes various AMCSs and HARQs by controlling a puncturing pattern provided to a channel encoder 412.

Figure 2:
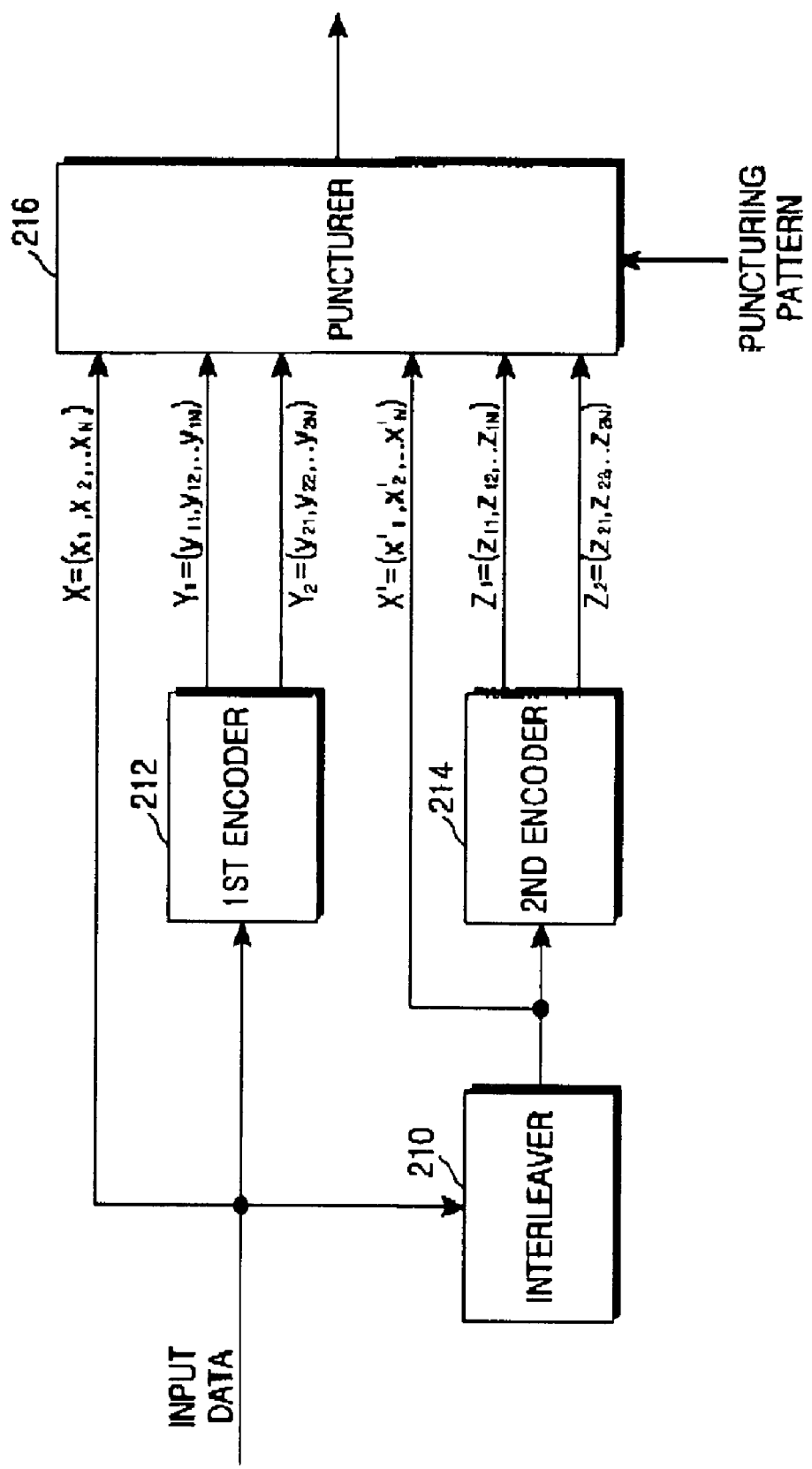
FIG. 2 illustrates a detailed structure of the channel encoder illustrated in FIG. 1.
Figure 3:
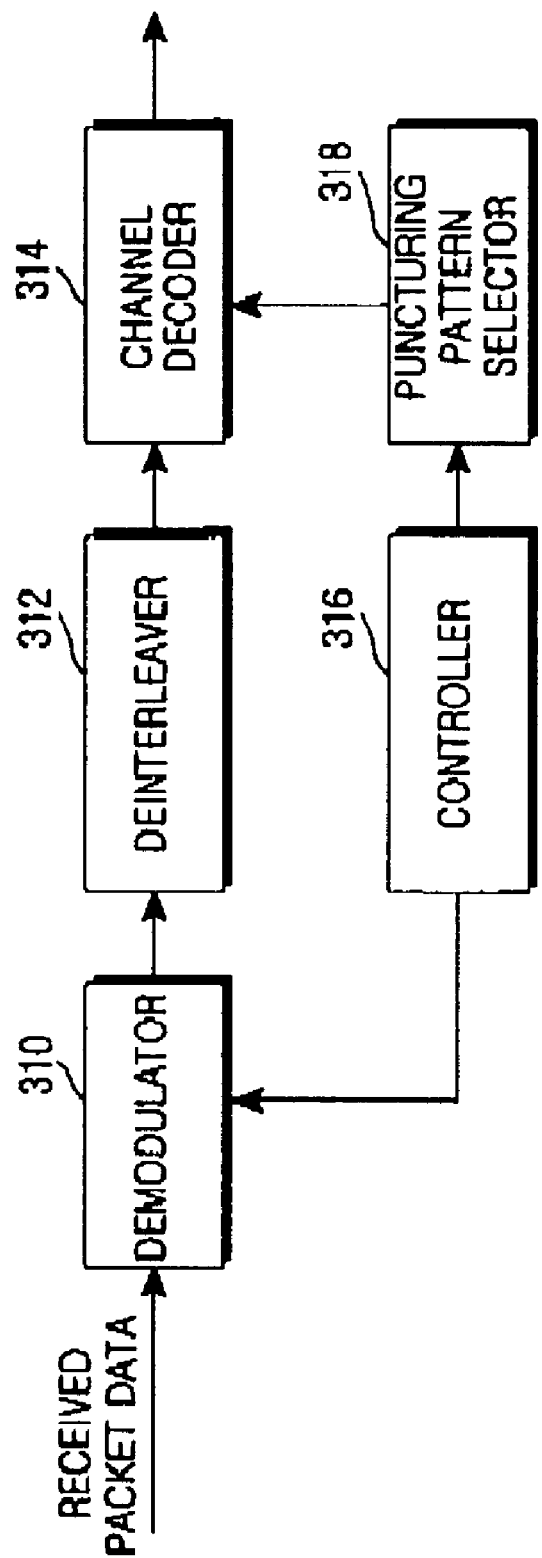
FIG. 3 illustrates a structure of a receiver in a conventional mobile communication system for high-speed packet transmission.

Referring to FIG. 4, the channel encoder 412 encodes transmission data at a given coding rate, and outputs coded bits comprised of systematic bits and parity bits. The channel encoder 412 is comprised of an encoder and a puncturer. The encoder has the same structure and the same operation as described in conjunction with FIG. 2. However, the puncturer punctures output bits of the encoder according to a puncturing pattern provided from a puncturing pattern generator 420.

A rate matcher 414 performs rate matching on the systematic bits and the parity bits provided from the channel encoder 412, and outputs the rate-matched systematic bits and parity bits to an interleaver 416. The interleaver 416 interleaves the systematic bits and the parity bits provided from the rate matcher 414 according to a given interleaving pattern, and provides the interleaved systematic bits and parity bits to a modulator 418.

The modulator 418 modulates the interleaved systematic bits and parity bits from the interleaver 416 by a given symbol mapping technique according to a modulation type to be used, and transmits the modulated systematic bits and parity bits to a receiver. The given symbol mapping technique is determined by the modulation type to be used. That is, the number of systematic bits and parity bits to be mapped to one symbol is determined by the modulation type to be used, and the modulator 418 maps the systematic bits and the parity bits to one symbol according to the determined number and transmits the symbol-mapped systematic bits and parity bits to the receiver. The modulator 418 is provided with information on the modulation type from a controller 422 or a retransmission controller 424.

The controller 422 controls the puncturing pattern generator 420 and the modulator 418 based on the coding rate and the modulation type agreed with the receiver according to the channel environment at initial transmission. The retransmission controller 424 changes its modulation type to a modulation type to be used at retransmission according to the condition of the transmission channel, and controls the puncturing pattern generator 420 and the modulator 418 according to the changed modulation type. Two methods of estimating a condition of a radio channel during retransmission and changing the modulation type according to the estimated channel condition have been proposed.

A first method is to determine the modulation type at a receiver. In this method, the receiver estimates a condition of the transmission channel, determines a modulation type according to the estimated condition of the transmission channel, and informs the transmitter of the determined modulation type through a HARQ control signal. When using this method, the retransmission controller 424 simply transmits control signals to the modulator 418 and the puncturing pattern generator 420 according to the HARQ control signal from the receiver.

A second method is to determine the modulation type at a transmitter. In this method, the transmitter independently estimates a condition of the transmission channel and determines a modulation type according to the estimated condition of the transmission channel. When using this method, the retransmission controller 424 extends its role to a process of estimating the condition of the transmission channel. The condition of the transmission channel can be estimated by the HARQ control signal provided from the receiver. The transmitter informs the receiver of the determined modulation type so that the receiver can cope with the data transmitted according the changed modulation type.

The retransmission controller 424 determines the modulation type according to the HARQ control signal provided from the receiver, or determines the modulation type under the control of an upper processor (not shown). In the former case, it shall be construed that the retransmission controller 424 includes the upper processor.

At initial transmission, the puncturing pattern generator 420 provides the channel encoder 412 with a puncturing pattern corresponding to a modulation type to be used, under the control of the controller 422. However, at retransmission, the puncturing pattern generator 420 provides the channel encoder 412 with a puncturing pattern corresponding to the modulation type to be used, under the control of the retransmission controller 424. The puncturing pattern generator 420 should have puncturing patterns corresponding to the available modulation types. For example, as illustrated in Table 1, when the modulation type is changed from 16QAM to QPSK, the number of coded bits to be transmitted is decreased by 2, compared with the number of the previously coded bits. In this case, the puncturing pattern generator 420 provides the channel encoder 412 with a new puncturing pattern that punctures 2 more coded bits compared with the previously used puncturing pattern. Providing the new puncturing pattern that punctures more coded bits means a decrease in the number of coded bits to be mapped to one symbol in the modulator 418, since a condition of the transmission channel becomes worse. However, as illustrated in Table 1, when the modulation type is changed from QPSK to 64QAM, the number of coded bits to be transmitted is increased by 4, compared with the number of the previously coded bits. In this case, the puncturing pattern generator 420 provides the channel encoder 412 with a new puncturing pattern that punctures 4 less coded bits compared with the previously used puncturing pattern. Providing the new puncturing pattern that punctures less coded bits means an increase in the number of coded bits to be mapped to one symbol in the modulator 418, since a condition of the transmission channel becomes better. As stated above, the puncturing pattern generator 420 generates a puncturing pattern for puncturing coded bits according to the number of the coded bits that can be mapped to one symbol, thus to cope with a variation in the modulation types.

Figure 5:
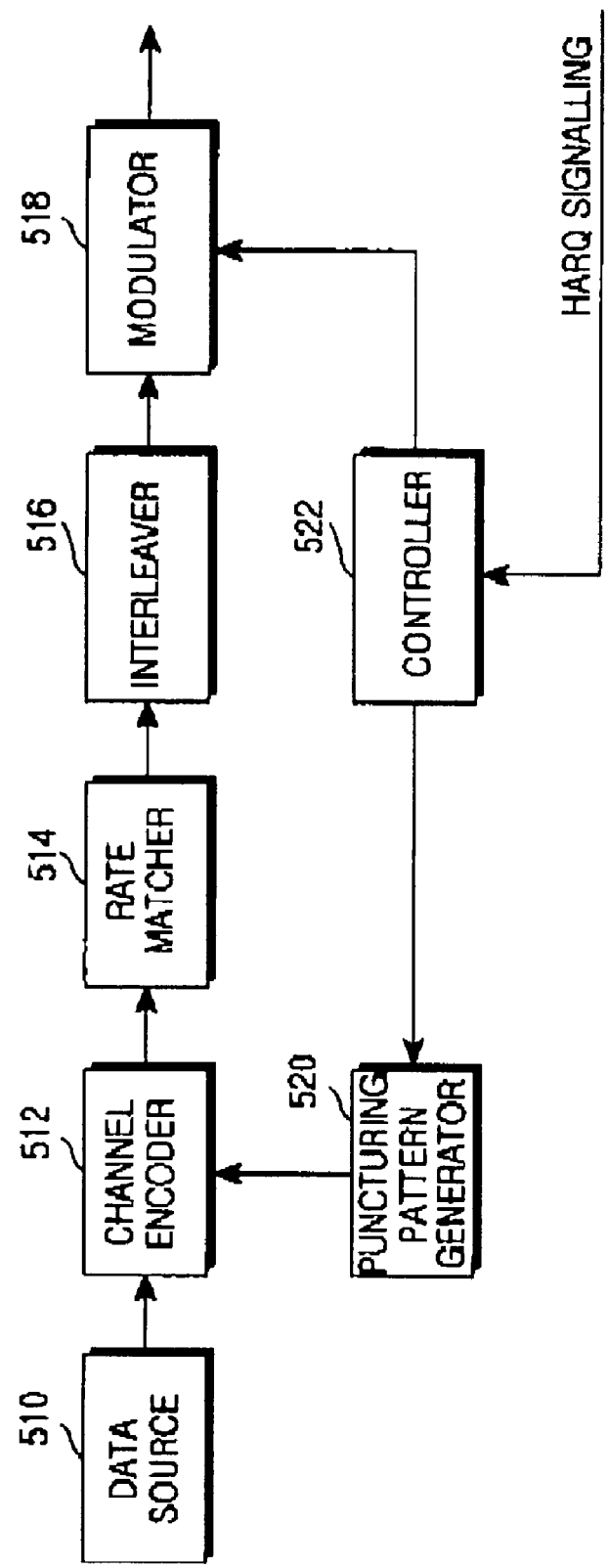
FIG. 5 illustrates another structure of a transmitter in a CDMA mobile communication system for high-speed packet transmission according to an embodiment of the present invention.

Meanwhile, the retransmission controller 424 has a duplicated function with the controller 422 that controls the puncturing pattern generator 420 and the modulator 418 according to given coding rate and modulation type at initial transmission, so the two controllers may be united in an alternative embodiment. FIG. 5 illustrates a structure of a transmitter in which the retransmission controller 424 and the controller 422 of FIG. 4 are united. In the transmitter of FIG. 5, a united controller 522 controls a puncturing pattern generator 520 and a modulator 518 at both initial transmission and retransmission.

Figure 6:
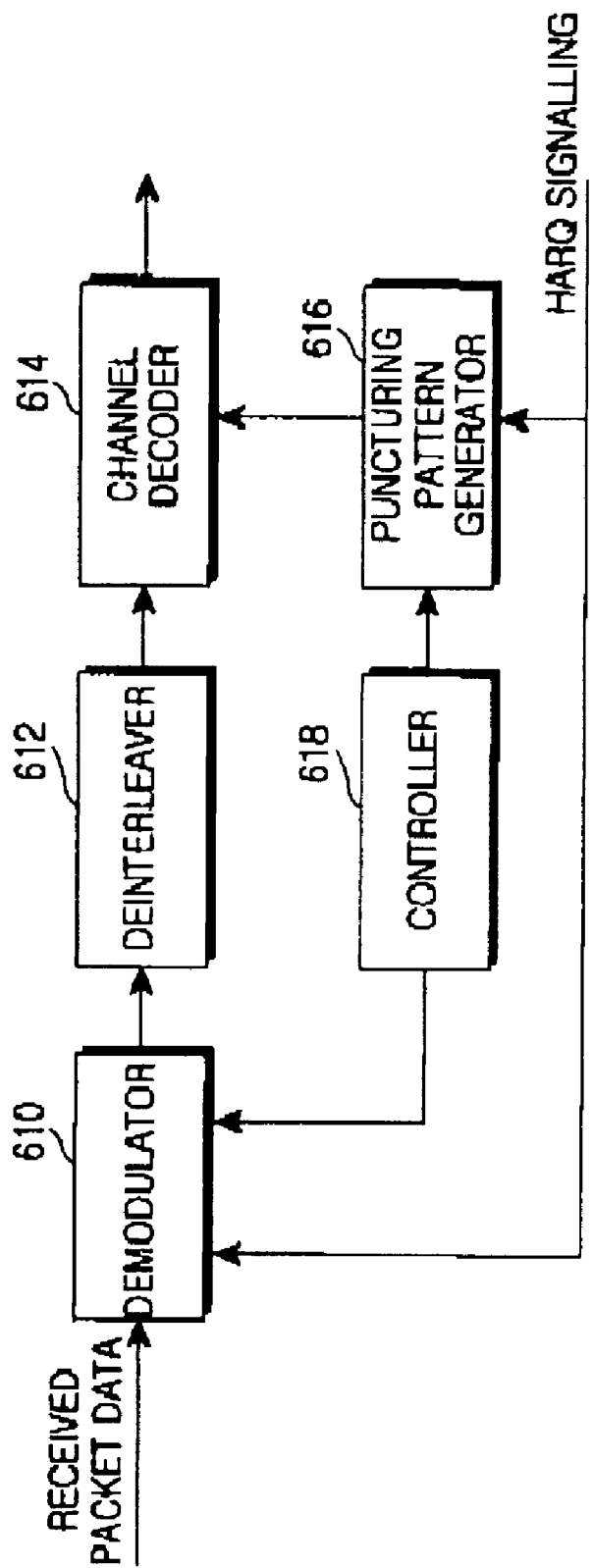
FIG. 6 illustrates a structure of a receiver corresponding to the transmitter illustrated in FIGS. 4 and 5.

FIG. 6 illustrates a structure of a receiver corresponding to the transmitter of FIG. 4 or FIG. 5. Referring to FIG. 6, a demodulator 610 demodulates initially transmitted packet data by a demodulation type corresponding to the modulation type used by the transmitter, and outputs symbol data into coded bits. Information on the modulation type used by the transmitter is provided from the controller 618. Upon receiving a HARQ control signal, the demodulator 610 performs demodulation according to the HARQ technique used and the demodulation type corresponding to the modulation type used by the transmitter, and outputs symbol data into coded bits.

A deinterleaver 612 deinterleaves the coded bits provided from the demodulator 610 according to an interleaving pattern used by the transmitter, and provides the deinterleaved coded bits to a channel decoder 614. That is, the deinterleaver 612 has a structure corresponding to the structure of the interleaver 516 in the transmitter.

The channel decoder 614 decodes the deinterleaved coded bits from the deinterleaver 612 by a given decoding technique, and outputs desired received bits. For the given coding technique, a technique for receiving systematic bits and parity bits and decoding the systematic bits is used, and the decoding technique is determined according to the coding technique used by the transmitter. The channel decoder 614 is provided with a puncturing pattern from a puncturing pattern generator 616 in order to decode the coded bits. That is, since the coded bits were punctured by the transmitter according to a given puncturing pattern, an operation of inserting 0's in the punctured positions is required for decoding.

The controller 618 controls the puncturing pattern generator 616 and the demodulator 610 by a coding rate and a demodulation type, which are agreed with the transmitter according to the channel condition at initial transmission. That is, the controller 618 controls both demodulation and decoding according to initial transmission and retransmission. Further, the controller 618 changes a modulation type to be used at retransmission according to a condition of the transmission channel, and controls the puncturing pattern generator 616 and the demodulator 610 by the changed modulation type. At retransmission, the controller 618 controls the puncturing pattern generator 616 using the HARQ. A method for estimating a condition of the transmission channel during retransmission and changing the modulation type according to the measured channel condition is divided into a method of determining the modulation type at a receiver and another method of determining the modulation type at a transmitter. Those methods are the same as the methods described in conjunction with FIG. 4, so the detailed description will not be provided. In the method of determining the modulation type at the receiver, the receiver should transmit information on the determined modulation type through a HARQ control signal to the transmitter.

The puncturing pattern generator 616 provides the channel decoder 614 with a puncturing pattern according to the modulation to be used, under the control of the controller 618. Therefore, the puncturing pattern generator 616 should have puncturing patterns corresponding to the modulation types, which are changed according to a variation of the condition of the transmission channel. Meanwhile, the puncturing pattern generator 616 should provide the channel decoder 614 with the same puncturing pattern as the puncturing pattern generated by the puncturing pattern generator 420 (or 520) included in the transmitter.

Figure 7:
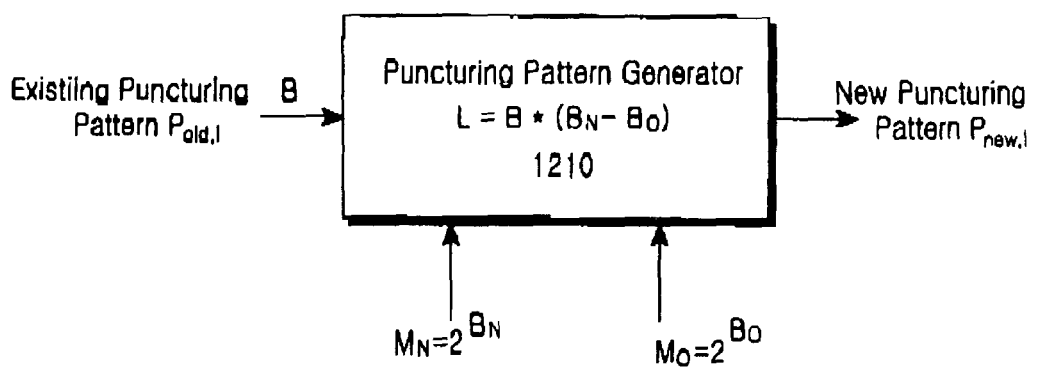
FIG. 7 illustrates an input and an output of a puncturing pattern generator according to an embodiment of the present invention.

FIG. 7 illustrates an input and an output of a puncturing pattern generator included in both a transmitter and a receiver according to an embodiment of the present invention. The puncturing pattern generator of FIG. 7 generates an increase/decrease puncturing pattern by calculating the number L of bits that should be newly added to a new puncturing pattern, and generates the new puncturing pattern by combining the increase/decrease puncturing pattern with an existing puncturing pattern. The number L is calculated by multiplying the number B of symbols per puncturing pattern according to the existing modulation type by the number $B_N$–$B_O$ of bits per symbol, which should be increased or decreased. Here, $B_N$ denotes the number of coded bits that can be mapped to one symbol according to a new modulation type $M_N$, and $B_O$ denotes the number of coded bits that can be mapped to one symbol according to the existing modulation type $M_O$. The number $B_N$–$B_O$ of bits that should be increased or decreased according to a variation of the modulation types is illustrated in Table 1. For example, let's assume that the modulation type is changed from QPSK to 64QAM and the coded bits output by a puncturing pattern used by the QPSK are mapped to two (B) symbols. In this case, as the modulation type is changed to 64QAM, the number of bits to be newly changed is determined as 2×(6−2)=8.

Next, a method of generating an increase/decrease puncturing pattern after determining the L will be described. The method of generating an increase/decrease puncturing pattern can be divided into a regular generation method and a selective generation method.

The regular generation method generates an increase/decrease puncturing pattern by a specified method without considering the previously used puncturing pattern and priority. The regular generation method can be realized as the simplest method, but has lower efficiency compared with the selective generation method. For example, since the regular generation method is not required to consider the previously used puncturing pattern, it can fill as many 1's as the number L, beginning at the top of a left column of the puncturing pattern in a right or lower direction. Alternatively, the regular generation method can fill as many 1's as the number L, beginning at the bottom of a right column of the puncturing pattern in a left or upper direction. Since this is an agreement between the transmitter and the receiver, the transmitter and the receiver generate the increase/decrease puncturing pattern according to the same rule.

The selective generation method includes various methods according to an intention of a designer on the following conditions. When occasion demands, a combination of the conditions is available.

First, 1's of the puncturing pattern are arranged according to priority of the coded bits. That is, 1's of the puncturing pattern are arranged in positions of the coded bits with higher priority, or 1's of the puncturing pattern are arranged in positions of the coded bits with lower priority.

Second, 1's of the puncturing pattern are arranged in positions of systematic bits of the coded bits, or 1's of the puncturing pattern are arranged in positions of parity bits of the coded bits.

Third, 1's of the puncturing pattern are arranged in positions of the previously transmitted coded bits, or 1's of the puncturing pattern are arranged in positions of the previously non-transmitted coded bits.

In the above-stated conditions, "mapping 1's to the punctured bits means transmitting the corresponding bits without puncturing.

An operation according to the embodiment of the present invention will now be described in detail with reference to the accompanying drawings. In the following description, the embodiment of the present invention provides a method of puncturing the coded bits mapped to one symbol at a modulator at a coding rate ¾. Further, a description will be made as to a detailed operation of the puncturing pattern generator on the assumption that the modulation type to be used is previously determined by the controller.

OPERATION OF EXAMPLE #1

Equation (7) below shows a method of generating a new puncturing pattern by an increase/decrease puncturing pattern generation method applying the regular generation method, for L=4. Here, "L=4" means that the number of coded bits output per one puncturing pattern matrix is increased by 4. That is, it can be understood that the number of coded bits that can be mapped to one symbol by the modulation type determined by the controller is increased compared with the number of coded bits that can be mapped to one symbol by the previously used modulation type.

The regular generation method, as described above, is a method of simply generating the increase/decrease puncturing pattern in a specified order without assigning priority to a specific bit. A given agreement should be previously made between a receiver and a transmitter, and the agreement depends upon an intention of a designer. Equation (7) shows that a new puncturing pattern matrix is calculated by adding an increase/decrease puncturing pattern matrix to an existing puncturing pattern matrix.

$$\begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} + \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 0 & 0 \\ 0 & 0 & 0 & 0 & 0 & 0 \end{bmatrix} = \quad \text{Equation (7)}$$

$$\begin{bmatrix} 2 & 1 & 1 & 1 & 1 & 1 \\ 0 & 1 & 1 & 0 & 0 & 0 \\ 0 & 0 & 1 & 0 & 0 & 0 \\ 0 & 0 & 0 & 1 & 0 & 0 \\ 0 & 0 & 0 & 0 & 0 & 1 \\ 0 & 0 & 0 & 0 & 0 & 0 \end{bmatrix}$$

The rule used in Equation (7) is an exemplary method of arranging 1's in a diagonal direction from the left top to the right bottom in selecting 4 coded bits to be additionally transmitted due to a variation in the modulation type. It is noted from Equation (7) that 6 systematic bits and 2 parity bits among the coded bits from an encoder were transmitted by QPSK at previous transmission. Meanwhile, as the modulation type is increased to a high modulation order, four 1's are additionally arranged in the increase/decrease puncturing pattern. It is possible to obtain a new puncturing pattern matrix by adding the increase/decrease puncturing pattern matrix to the existing puncturing pattern matrix in a pattern unit. As a result, the number of coded bits output from the channel encoder by the new puncturing pattern matrix becomes 12. In Equation (7), "2" means that the corresponding coded bit is repeated twice.

OPERATION OF EXAMPLE #2

Equation (8) below shows a method of generating a new puncturing pattern matrix by an increase/decrease puncturing pattern generation method applying the selective generation method, for L=4. Here, "L=4" means that the number of coded bits per one puncturing pattern matrix is increased by 4. That is, it can be understood that the number of coded bits that can be mapped to one symbol by the modulation type determined by the controller is increased compared with the number of coded bits that can be mapped to one symbol by the previously used modulationtype. The selective generation method can provide more methods than the regular generation method, by assigning priority to a specific coded bit agreed between the transmitter and the receiver. Equation (8) shows that a new puncturing pattern matrix is calculated by adding an increase/decrease puncturing pattern matrix to an existing puncturing pattern matrix.

$$\begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} + \begin{bmatrix} 0 & 0 & 0 & 0 & 0 & 0 \\ 1 & 0 & 0 & 0 & 1 & 0 \\ 0 & 1 & 0 & 0 & 0 & 0 \\ 0 & 0 & 0 & 0 & 0 & 0 \\ 0 & 0 & 0 & 0 & 0 & 0 \\ 0 & 0 & 0 & 1 & 0 & 0 \end{bmatrix} = \quad \text{Equation (8)}$$

$$\begin{bmatrix} 1 & 1 & 1 & 1 & 1 & 1 \\ 0 & 0 & 1 & 0 & 1 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 1 & 0 & 0 \end{bmatrix}$$

The rule used in Equation (8) is an exemplary method of arranging 1's in positions of previously non-transmitted parity bits in selecting 4 coded bits to be additionally transmitted due to a variation in the modulation type. It is noted from Equation (8) that 6 systematic bits and 2 parity bits among the coded bits from an encoder were transmitted at previous transmission. That is, it indicates that the coding rate is ¾. Meanwhile, as the modulation type is increased, four 1's are additionally arranged in the increase/decrease puncturing pattern. It is possible to obtain a new puncturing pattern matrix by adding the increase/decrease puncturing pattern matrix to the existing puncturing pattern matrix in a pattern unit. As a result, the number of coded bits output from the channel encoder by the new puncturing pattern matrix becomes 12.

OPERATION OF EXAMPLE #3

Equation (9) below shows a method of generating a new puncturing pattern matrix by an increase/decrease puncturing pattern generation method applying the regular generation method, for L=−4. Here, "L=−4" means that the number of coded bits output per one puncturing pattern matrix is decreased by 4. That is, it can be understood that the number of coded bits that can be mapped to one symbol by the modulation type determined by the controller is decreased compared with the number of coded bits that can be mapped to one symbol by the previously used modulation type due to deterioration of the channel environment. This means that the modulation type is changed to a low modulation order.

The regular generation method, as described above, is a method of simply generating the increase/decrease puncturing pattern in a specified order without assigning priority to a specific bit. A given agreement should be previously made between a receiver and a transmitter, and the agreement depends upon an intention of the designer. Equation (9) shows that a new puncturing pattern matrix is calculated by subtracting an increase/decrease puncturing pattern matrix from an existing puncturing pattern matrix. When the L has a negative value indicating subtraction, the increase/decrease puncturing pattern matrix should be selected among 1's included in the existing puncturing pattern.

$$\begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} - \begin{bmatrix} 1 & 1 & 1 & 1 & 0 & 0 \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \end{bmatrix} = \quad \text{Equation (9)}$$

$$\begin{bmatrix} 0 & 0 & 0 & 0 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix}$$

The rule used in Equation (9) is an exemplary method of arranging 1's from the left top to the right top in selecting 4 coded bits to be deleted due to a variation in the modulation type. It is noted from Equation (9) that 6 systematic bits and 2 parity bits among the coded bits from an encoder were transmitted at previous transmission. Meanwhile, as the modulation type is changed from a high modulation order to a low modulation order, 1's are additionally arranged in positions of 4 systematic bits in the increase/decrease puncturing pattern. It is possible to obtain a new puncturing pattern matrix by subtracting the increase/decrease puncturing pattern matrix from the existing puncturing pattern matrix in a pattern unit. As a result, the number of coded bits output from the channel encoder by the new puncturing pattern matrix is decreased by 4.

OPERATION OF EXAMPLE #4

Equation (10) below shows a method of generating a new puncturing pattern matrix by an increase/decrease puncturing pattern generation method applying the selective generation method, for L=−4. Here, "L=−4" means that the number of coded bits per one puncturing pattern matrix is decreased by 4. That is, it can be understood that the number of coded bits that can be mapped to one symbol by the modulation type determined by the controller is decreased compared with the number of coded bits that can be mapped to one symbol by the previously used modulation type. This means that the modulation type has been changed from a high modulation order to a low modulation order. The selective generation method can provide more methods than the regular generation method, by assigning priority to a specific coded bit agreed between the transmitter and the receiver. Equation (10) shows that a new puncturing pattern matrix is calculated by subtracting an increase/decrease puncturing pattern matrix from an existing puncturing pattern matrix.

$$\begin{bmatrix} 1 & 1 & 1 & 1 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} - \begin{bmatrix} 0 & 0 & 0 & 0 & 1 & 1 \\ 0 & 0 & 1 & 0 & 0 & 0 \\ 0 & 0 & 0 & 0 & 0 & 0 \\ 0 & 0 & 0 & 0 & 0 & 0 \\ 0 & 0 & 0 & 0 & 0 & 1 \\ 0 & 0 & 0 & 0 & 0 & 0 \end{bmatrix} = \quad \text{Equation (10)}$$

$$\begin{bmatrix} 1 & 1 & 1 & 1 & 0 & 0 \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \end{bmatrix}$$

In Equation (10), the rule is determining the increase/decrease puncturing pattern matrix is an exemplary method of giving priority to parity bits and arranging 1's such that if a size of L is larger than the number of the parity bits, systematic bits are deleted from the right to the left. That is, as the number of non-punctured parity bits in the existing puncturing pattern matrix is 2, the increase/decrease puncturing pattern matrix grants 1's to two parity bits. Meanwhile, the remaining two 1's are granted such that puncturing should be performed from the right to the left on the 6 non-punctured systematic bits in the existing puncturing pattern matrix. It is noted from Equation (10) that 6 systematic bits and 2 parity bits among the coded bits from an encoder were transmitted at previous transmission. Meanwhile, as the modulation type is changed from a high modulation order to a low modulation order, 1's are additionally arranged in positions of 2 parity bits and 2 systematic bits in the increase/decrease puncturing pattern. It is possible to obtain a new puncturing pattern matrix by subtracting the increase/decrease puncturing pattern matrix from the existing puncturing pattern matrix in a pattern unit. As a result, the number of coded bits output from the channel encoder by the new puncturing pattern matrix is decreased to 4.

As described above, the present invention realizes an apparatus and method for optimally coping with a variation in channel environment during retransmission while using a TTI with a fixed length. When applied to a 3$^{rd}$ generation radio packet communication system, the present invention has the following advantages.

First, in a 3$^{rd}$ generation radio packet communication system employing the HSDPA and the 1xEV-DV, many discussions have been held on the TTI, particularly, on a fixed TTI and a variable TTI. The fixed TTI and the variable TTI have their advantages and disadvantages, but there is no solution for satisfying both yet. The invention proposes a method for taking only the advantages of the two methods, thereby solving the disadvantage of the fixed TTI that the modulation order cannot be changed during retransmission, and also solving the complexity problem of the variable TTI.

Second, since the HSDPA and 1xEV-DV systems have 7 AMCS levels or more AMCS levels (when QPSK, 8PSK, 16QAM, 64QAM, and several coding rates are used), they must transmit generated information with a minimum of 3 bits or more. However, the present invention transmits information on 4 demodulation types (QPSK, 8PSK, 16QAM, and 64QAM), so the information can be expressed with only 2 bits.

Third, the invention can be applied to all of the CC, the FIR and the PIR of the HARQ.

Due to the above advantages, the present invention can be applied to every packet transmission system. When applied to the HSDPA and the 1xEV-DV presently under discussion in the 3GPP and 3GPP2 standardization conferences, the present invention can improve the overall system performance.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for generating a retransmission puncturing pattern matrix in order to transmit a packet unit including a stream of symbols and another stream of symbols according to a first modulation type and a second modulation type in response to a retransmission request from a receiver, in a mobile communication system puncturing coded bits from an encoder according to a first puncturing pattern matrix given based on the first modulation type, and transmitting a packet unit including a stream of symbols obtained by symbol mapping the punctured coded bits by the first modulation type, from a transmitter to the receiver, the method comprising the steps of:

calculating a number of bits per a puncturing pattern matrix, to be increased or decreased, by multiplying a difference $B_N-B_O$ between a number $B_N$ of coded bits that can be mapped to one symbol by the second modulation type and a number $B_O$ of coded bits that can be mapped to one symbol by the first modulation type, by a number B of symbols mapped to bits that are not punctured according to the first puncturing pattern matrix given based on the first modulation type;

generating a second puncturing pattern matrix based on the number of bits per the puncturing pattern matrix; and generating the retransmission puncturing pattern matrix by combining the first puncturing pattern matrix with the second puncturing pattern matrix.

2. The method of claim 1, wherein the first and second modulation types include QPSK (Quadrature Phase Shift Keying), 8PSK (8-ary Phase Shift Keying), 16QAM (16-ary Quadrature Amplitude Modulation), and 64QAM (64-ary Quadrature Amplitude Modulation).

3. The method of claim 1, wherein if a current transmission channel condition is better than a previous transmission channel condition, the second modulation type is set to be a modulation type by which a number of coded bits that can be mapped to one symbol is increased compared with the first modulation type; and wherein if the current transmission channel condition is worse than the previous transmission channel condition, the second modulation type is set to be a modulation type by which the number of coded bits that can be mapped to one symbol is decreased compared with the first modulation type.

4. The method of claim 1, wherein the first puncturing pattern matrix is added to the second puncturing pattern matrix in a pattern unit when the number of bits per the puncturing pattern matrix is to be increased; and wherein the second puncturing pattern matrix is subtracted from the first puncturing pattern matrix in a pattern unit when the number of bits per the puncturing pattern matrix is to be decreased.

5. The method of claim 1, wherein the second puncturing pattern matrix is generated according to retransmission of the coded bits.

6. The method of claim 1, wherein the second puncturing pattern matrix is generated according to a given rule previously determined by an agreement with the receiver.

7. The method of claim 1, wherein the second puncturing pattern matrix is generated according to priority of the coded bits.

8. The method of claim 7, wherein a higher priority is assigned to systematic bits of the coded bits, and a lower priority is assigned to parity bits of the coded bits.

9. An apparatus for generating a retransmission puncturing pattern matrix in order to transmit a packet unit including a stream of symbols and another stream of symbols according to a first modulation type and a second modulation type in response to a retransmission request from a receiver, in a transmitter for a mobile communication system including a puncturer for puncturing coded bits from an encoder according to a first puncturing pattern matrix based on the first modulation type, and a modulator for generating a stream of symbols obtained by symbol mapping the punctured coded bits by the first modulation type, the apparatus comprising:
   a controller for determining the second modulation type according to a variation in a transmission channel condition in response to the retransmission request; and
   a puncturing pattern generator for calculating a number of bits per a puncturing pattern matrix, to be increased or decreased, by multiplying a difference $B_N - B_0$ between a number $B_N$ of coded bits that can be mapped to one symbol by the second modulation type and a number $B_0$ of coded bits that can be mapped to one symbol by the first modulation type, by a number B of symbols mapped to bits that are not punctured according to the first puncturing pattern matrix based on the first modulation type, generating a second puncturing pattern matrix based on the number of bits per the puncturing pattern matrix, and generating the retransmission puncturing pattern matrix by combining the first puncturing pattern matrix with the second puncturing pattern matrix.

10. The apparatus of claim 9, wherein the first and second modulation types include QPSK (Quadrature Phase Shift Keying), 8PSK (8-ary Phase Shift Keying), 16QAM (16-ary Quadrature Amplitude Modulation), and 64QAM (64-ary Quadrature Amplitude Modulation).

11. The apparatus of claim 9, wherein the controller determines the second modulation type to be a modulation type by which the number of coded bits that can be mapped to one symbol is increased compared with the first modulation type, if a current transmission channel condition is better than a previous transmission channel condition; and wherein the controller determines the second modulation type to be a modulation type by which the number of coded bits that can be mapped to one symbol is decreased compared with the first modulation type, if the current transmission channel condition is worse than the previous transmission channel condition.

12. The apparatus of claim 9, wherein the puncturing pattern generator generates the retransmission puncturing pattern matrix by adding the first puncturing pattern matrix to the second puncturing pattern matrix in a pattern unit when the number of bits per the puncturing pattern matrix is to be increased, and subtracting the second puncturing pattern matrix from the first puncturing pattern matrix in a pattern unit when the number of bits per the puncturing pattern matrix is to be decreased.

13. The apparatus of claim 9, wherein the second puncturing pattern matrix is generated according to retransmission of the coded bits.

14. The apparatus of claim 9, wherein the second puncturing pattern matrix is generated according to a given rule, previously determined by an agreement with the receiver.

15. The apparatus of claim 9, wherein the second puncturing pattern matrix is generated according to priority of the coded bits.

16. The apparatus of claim 15, wherein a higher priority is assigned to systematic bits of the coded bits, and a lower priority is assigned to parity bits of the coded bits.

17. A method for generating a retransmission puncturing pattern matrix in order to decode coded bits and other coded bits according to a first modulation type and a second modulation type from a transmitter, in a receiver for a mobile communication system demodulating symbols transmitted in a packet unit by the first modulation type from the transmitter, and inserting 0's in the coded bits according to the first puncturing pattern matrix based on the first modulation type before decoding, the method comprising the steps of:
   calculating a number of bits per a puncturing pattern matrix, to be increased or decreased, by multiplying a difference $B_N - B_0$ between a number $B_N$ of coded bits that can be mapped to one symbol by the second modulation type and a number $B_0$ of coded bits that can be mapped to one symbol by the first modulation type, by a number B of symbols mapped to bits that are not punctured according to the first puncturing pattern matrix given based on the first modulation type;
   generating a second puncturing pattern matrix based on the number of bits per the puncturing pattern matrix; and
   generating the retransmission puncturing pattern matrix by combining the first puncturing pattern matrix with the second puncturing pattern matrix.

18. The apparatus of claim 17, wherein the first and second modulation types include QPSK (Quadrature Phase Shift Keying), 8PSK (8-ary Phase Shift Keying), 16QAM (16-ary Quadrature Amplitude Modulation), and 64QAM (64-ary Quadrature Amplitude Modulation).

19. The apparatus of claim 17, wherein if a current transmission channel condition is better than a previous transmission channel condition, a modulation type by which the number of coded bits that can be mapped to one symbol is increased compared with the first modulation type is selected as the second modulation type; and wherein if the current transmission channel condition is worse than the previous transmission channel condition, a modulation type by which the number of coded bits that can be mapped to one symbol is decreased compared with the first modulation type is selected as the second modulation type.

20. The apparatus of claim 17, wherein the first puncturing pattern matrix is added to the second puncturing pattern matrix in a pattern unit when the number of bits per the puncturing pattern matrix is to be increased; and wherein the second puncturing pattern matrix is subtracted from the first puncturing pattern matrix in a pattern unit when the number of bits per the puncturing pattern matrix is to be decreased.

21. The apparatus of claim 17, wherein the second puncturing pattern matrix is generated according to retransmission of the coded bits.

22. The apparatus of claim 17, wherein the second puncturing pattern matrix is generated according to a given rule, previously determined by an agreement with the receiver.

23. The apparatus of claim 17, wherein the second puncturing pattern matrix is generated according to priority of the coded bits.

24. The apparatus of claim 23, wherein a higher priority is assigned to systematic bits of the coded bits, and a lower priority is assigned to parity bits of the coded bits.

25. An apparatus for generating a retransmission puncturing pattern matrix in order to decode coded bits and other coded bits according to a first modulation type and a second modulation type from a transmitter, in a receiver for a mobile communication system including a demodulator for demodulating symbols transmitted in a packet unit by the first modulation type from the transmitter into coded bits, and a decoder for inserting 0's in the coded bits according to the first puncturing pattern matrix based on the first modulation type before decoding, the apparatus comprising:

a controller for determining the second modulation type according to a variation in a transmission channel condition after sending a retransmission request to the transmitter; and a puncturing pattern generator for calculating a number of bits per a puncturing pattern matrix, to be increased or decreased, by multiplying a difference $B_N - B_0$ between a number $B_N$ of coded bits that can be mapped to one symbol by the second modulation type and a number $B_0$ of coded bits that can be mapped to one symbol by the first modulation type, by a number B of symbols mapped to bits that are not punctured according to the first puncturing pattern matrix based on the first modulation type, generating a second puncturing pattern matrix based on the number of bits per the puncturing pattern matrix, and generating the retransmission puncturing pattern matrix by combining the first puncturing pattern matrix with the second puncturing pattern matrix.

26. The apparatus of claim 25, wherein the first and second modulation types include QPSK (Quadrature Phase Shift Keying), 8PSK (8-ary Phase Shift Keying), 16QAM (16-ary Quadrature Amplitude Modulation), and 64QAM (64-ary Quadrature Amplitude Modulation).

27. The apparatus of claim 25, wherein the controller determines the second modulation type to be a modulation type by which the number of coded bits that can be mapped to one symbol is increased compared with the first modulation type, if a current transmission channel condition is better than a previous transmission channel condition; and wherein the controller determines the second modulation type to be a modulation type by which the number of coded bits that can be mapped to one symbol is decreased compared with the first modulation type, if a current transmission channel condition is worse than a previous transmission channel condition.

28. The apparatus of claim 25, wherein the puncturing pattern generator generates the retransmission puncturing pattern matrix by adding the first puncturing pattern matrix to the second puncturing pattern matrix in a pattern unit when the number of bits per the puncturing pattern matrix is to be increased; and subtracting the second puncturing pattern matrix from the first puncturing pattern matrix in a pattern unit when the number of bits per the puncturing pattern matrix is to be decreased.

29. The apparatus of claim 25, wherein the second puncturing pattern matrix is generated according to retransmission of the coded bits.

30. The apparatus of claim 25, wherein the second puncturing pattern matrix is generated according to a given rule, previously determined by an agreement with the receiver.

31. The apparatus of claim 25, wherein the second puncturing pattern matrix is generated according to priority of the coded bits.

32. The apparatus of claim 31, wherein a higher priority is assigned to systematic bits of the coded bits, and a lower priority is assigned to parity bits of the coded bits.

* * * * *